United States Patent [19]

Fournier

[11] Patent Number: 4,858,143
[45] Date of Patent: Aug. 15, 1989

[54] WORK ORDERING ROUTINE FOR USE IN A METHOD OF ROUTING

[75] Inventor: Serge Fournier, Montreal, Quebec, Canada

[73] Assignee: Bell-Northern Research, Ltd., Ottawa, Canada

[21] Appl. No.: 911,386

[22] Filed: Sep. 25, 1986

[51] Int. Cl.$^4$ .............................................. G06F 15/20
[52] U.S. Cl. .................................... 364/491; 364/489
[58] Field of Search .............................. 364/488–491; 357/40, 45

[56] References Cited

U.S. PATENT DOCUMENTS

| | | | |
|---|---|---|---|
| 4,441,207 | 4/1984 | Lougheed et al. | 382/8 |
| 4,495,559 | 1/1985 | Gelatt, Jr. et al. | 364/148 |
| 4,500,963 | 2/1985 | Smith et al. | 364/300 |
| 4,510,616 | 4/1985 | Lougheed et al. | 382/8 |
| 4,593,363 | 6/1986 | Burstein et al. | 364/491 |
| 4,613,941 | 9/1986 | Smith et al. | 364/490 |
| 4,615,011 | 9/1986 | Linsker | 364/491 |
| 4,636,965 | 1/1987 | Smith et al. | 364/489 |

FOREIGN PATENT DOCUMENTS 2131577 6/1984 United Kingdom ................. 364/489

OTHER PUBLICATIONS

Feuer et al., "Normalized Resistance Clustering Metric", *IBM Technical Disclosure Bulletin*, vol. 18, No. 12, pp. 4021–4022, May 1976.

Primary Examiner—P. S. Lall
Assistant Examiner—Brian M. Mattson
Attorney, Agent, or Firm—Foley & Lardner, Schwartz, Jeffery, Schwaab, Mack, Blumenthal & Evans

[57] ABSTRACT

In a routing method for efficiently routing the interconnections of a printed circuit board, the list of interconnections to be made is ordered to provide a work order for deriving routes. The circuit board is notionally divided into a grid of addressable cells. Then grid lines are considered in turn. A particular grid line may have a certain number (x) of cells that are full and so cannot be used for routing and other cells which are empty and so available for routing (capacity). If all interconnections to be made were made by direct spans then that particular grid line would have grid crossings occupying a certain number (y) of cells (occupancy). A MAOMIC (maximum occupancy-minimum capacity) product of that grid line is derived. When assigning routes, the routes of those interconnections which, if directly made, would cross the grid line of highest MAOMIC product are assigned first.

4 Claims, 17 Drawing Sheets

CAPACITY AT GRID
POSITION x=6 IS M=5

OCCUPANCY AT GRID
POSITION x=6 IS N=5

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | C |   |   |
| 3 |   |   |   |   |   |   | C | C | C |
| 4 |   | C | C |   | C |   | C |   |   |
| 5 |   |   |   |   |   |   | C |   |   |
| 6 |   |   |   |   |   |   | C |   |   |
| 7 |   |   |   |   |   |   |   |   |   |

TEMPORARY

INCREMENTAL COSTS
N-S  3
E-W  1
HALF 5

FIG. 11

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   |   |   |   |   |   | T | T | T |
| 4 |   |   |   |   | C |   | T |   |   |
| 5 |   |   |   |   |   |   | T |   |   |
| 6 |   |   |   |   |   |   | T |   |   |
| 7 |   |   |   |   |   |   |   |   |   |

TEMPORARY

INCREMENTAL COSTS
N-S  3
E-W  1
HALF 5

| | 1 | 2 | 3 | 4 | 5 | 6 | 7 | 8 | 9 |
|---|---|---|---|---|---|---|---|---|---|
| 1 | | | | | | | | | |
| 2 | | | | | | | T | | |
| 3 | | | | | | | T | T | T |
| 4 | | SEED | | | C | | T | | |
| 5 | | | | | | | T | | |
| 6 | | | | | | | T | | |
| 7 | | | | | | | | | |

INCREMENTAL COSTS
N-S    3
E-W    1
HALF   5

FIG. 14

| | 1 | 2 | 3 | 4 | 5 | 6 | 7 | 8 | 9 |
|---|---|---|---|---|---|---|---|---|---|
| 1 | | | | | | | | | |
| 2 | | | | | | | T | | |
| 3 | | | | | | | T | T | T |
| 4 | | SEED | | | C | | T | | |
| 5 | | | | | | | T | | |
| 6 | | | | | | | T | | |
| 7 | | | | | | | | | |

INCREMENTAL COSTS
N-S    3
E-W    1
HALF   5

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   |   |   |   |   |   | T | T | T |
| 4 |   | SEED | SEED |   | C |   | T |   |   |
| 5 |   |   |   |   |   |   | T |   |   |
| 6 |   |   |   |   |   |   | T |   |   |
| 7 |   |   |   |   |   |   |   |   |   |

(y-axis: TEMPORARY)

INCREMENTAL COSTS
N-S  3
E-W  1
HALF  5

FIG. 15

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   |   |   |   |   |   | T | T | T |
| 4 | → | SEED | SEED |   | C |   | T |   |   |
| 5 |   |   |   |   |   |   | T |   |   |
| 6 |   |   |   |   |   |   | T |   |   |
| 7 |   |   |   |   |   |   |   |   |   |

(y-axis: TEMPORARY)

INCREMENTAL COSTS
N-S  3
E-W  1
HALF  5

FIG. 16

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   |   |   |   |   |   | T | T | T |
| 4 |   |   |   |   |   |   | T |   |   |
| 5 | → | SEED | SEED | ← | C |   | T |   |   |
| 6 |   |   |   |   |   |   | T |   |   |
| 7 |   |   |   |   |   |   |   |   |   |

TEMPORARY (vertical axis label)

INCREMENTAL COSTS
N-S  3
E-W  1
HALF 5

FIG. 17

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   | ↓ |   |   |   |   | T | T | T |
| 4 | → | SEED | SEED | ← | C |   | T |   |   |
| 5 |   |   |   |   |   |   | T |   |   |
| 6 |   |   |   |   |   |   | T |   |   |
| 7 |   |   |   |   |   |   |   |   |   |

TEMPORARY (vertical axis label)

INCREMENTAL COSTS
N-S  3
E-W  1
HALF 5

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 |   | ↓ | ↓ |   |   |   | T | T | T |
| 4 | → | SEED | SEED | ← | C |   | T |   |   |
| 5 |   | ↑ | ↑ |   |   |   | T |   |   |
| 6 |   |   |   |   |   |   | T |   |   |
| 7 |   |   |   |   |   |   |   |   |   |

(y-axis: TEMPORARY)

INCREMENTAL COSTS
N-S  3
E-W  1
HALF 5

FIG. 20

|   | 1 | 2 | 3 | 4 | 5 | 6 | 7 | 8 | 9 |
|---|---|---|---|---|---|---|---|---|---|
| 1 |   |   |   |   |   |   |   |   |   |
| 2 |   |   |   |   |   |   | T |   |   |
| 3 | ↓ | ↓ | ↓ | ↓ |   |   | T | T | T |
| 4 | → | SEED | SEED | ← | C |   | T |   |   |
| 5 | ↑ | ↑ | ↑ | ↑ |   |   | T |   |   |
| 6 |   |   |   |   |   |   | T |   |   |
| 7 |   |   |   |   |   |   |   |   |   |

(y-axis: TEMPORARY)

INCREMENTAL COSTS
N-S  3
E-W  1
HALF 5

FIG. 21

| | 1 | 2 | 3 | 4 | 5 | 6 | 7 | 8 | 9 |
|---|---|---|---|---|---|---|---|---|---|
| 1 | | | | | | | | | |
| 2 | | | | | | | T | | |
| 3 | ↓ | ↓ | ↓ | ↓ | | | T | T | T |
| 4 | → | SEED | SEED | ← | C | | T | | |
| 5 | ↑ | ↑ | ↑ | ↑ | | | T | | |
| 6 | | | | | | | T | | |
| 7 | | | | | | | | | |

TEMPORARY

INCREMENTAL COSTS
N-S  3
E-W  1
HALF  5

FIG. 22

| | 1 | 2 | 3 | 4 | 5 | 6 | 7 | 8 | 9 |
|---|---|---|---|---|---|---|---|---|---|
| 1 | | | | | | | | | |
| 2 | | ↓ | ↓ | | | | T | | |
| 3 | ↓ | ↓ | ↓ | ↓ | ← | ← | T | T | T |
| 4 | → | SEED | SEED | ← | C | | T | | |
| 5 | ↑ | ↑ | ↑ | ↑ | ← | | T | | |
| 6 | | ↑ | ↑ | | | | T | | |
| 7 | | | | | | | | | |

TEMPORARY

INCREMENTAL COSTS
N-S  3
E-W  1
HALF  5

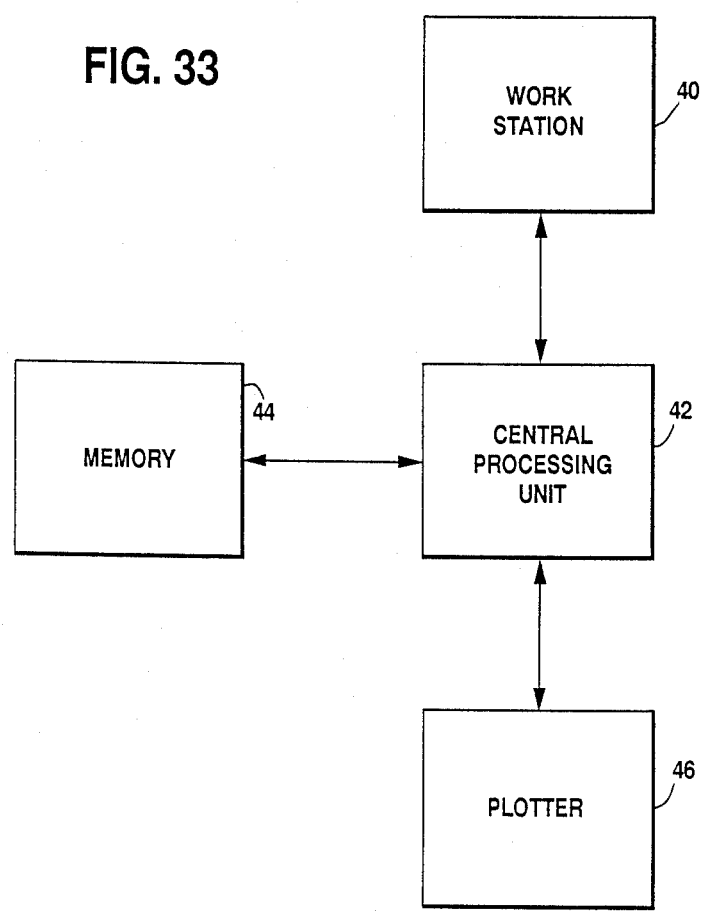

WORK ORDERING ROUTINE FOR USE IN A METHOD OF ROUTING

This invention relates to a work ordering routine for use in a routing method suitable for generating routes for implementing efficient interconnection of integrated circuit packages in a multilayer circuit board.

In a circuit board design method, there are two primary steps: deciding where integrated circuit packages will be placed and deciding where conductors should be routed to interconnect the packages. This invention is concerned with routing conductors after the package positions have been set.

In the specification, the following definitions apply:

Element—one of a number of items having a specific shape, size and XYZ position which are to be selectively interconnected.

Signal—elements have the same signal if they are, or must be, connected.

Sumnet—elements have the same sumnet if they are connected.

Disconnections—if two elements have the same signal but different sumnets, then a disconnection exists between them.

Interconnections—that selection from the disconnections obtained by applying the "minimum spanning tree"](MST) algorithm; also called "work to be done".

Route—a series of contiguous linear elements of specific length, orientation, and position which together define a path between two elements.

Cell—a sub-division of the interconnection medium.

A classical algorithm used for deriving interconnection routes for printed circuit boards is the Lee algorithm. While adequate for simple structures where the number of disconnections is low, the Lee algorithm requires an inordinate amount of memory if used for multi-chip circuit boards where there might be of the order of 4,000 disconnections.

In U.S. Pat. No. 4,777,606, filed on June 5, 1986, in my name, and entitled METHOD FOR ROUTING, there is described and claimed an alternative flooding routine whereby routes can be efficiently assigned without an inordinate memory requirement. Before running the routine for each interconnection, the interconnection work order must be derived. Ideally, the work order contributes to the minimization of memory required to implement multiple route assignment.

According to the invention, there is provided in a method of deriving interconnection routes between elements in a connection medium, the steps of ordering a number of such interconnections by:

generating a cell map consisting of a number of addressable cells representing grid positions in the connection medium;

designating certain of the cells which can accommodate routes as empty and designating remaining ones of the cells which cannot accommodate routes as full;

assessing the number of cells along each grid line which are empty and therefore can accommodate a route thereat (capacity);

assessing how many of the number of interconnections would, if implemented as direct routes, cross each grid line (occupancy);

deriving an occupancy capacity (MAOMIC) factor for each grid line, being a function of the product of the occupancy and the inverse of the capacity for that grid line;

and first deriving routes for those interconnections which would directly cross grid lines having the highest MAOMIC factor.

The MAOMIC factor represents the potential traffic at specific locations of a particular grid line. Connections are made first at the locations where the highest potential traffic exists. Clearly other expressions or factors representing the potential traffic can be derived and used providing that the effect is essentially to order the number of interconnections in a manner similar to that in which the MAOMIC factors are used to order the number of interconnections.

The cells can be rectangular cells derived by notionally dividing the area of the connection medium. The cell addresses can further include a layer level. Preferably such cells are of identical size.

The routes can have a predetermined width and permitted minimum spacing thereby representing a maximum number of routes that can pass perpendicularly across a grid line. The grid spacing can be chosen such that the nubmer of addressable cells along any one of the grid lines is the same as the maximum number of routes associated with the one grid line.

Particularly for routing connections between elements in an electrical circuit in which several elements of the circuit can have a common signal applied thereto, the method can further comprise running a minimum spanning tree routine to select $n-1$ interconnections from disconnections between 'n' elements having a common signal applied thereto, the $n-1$ interconnections having an aggregate direct interconnection span length which is the minimum aggregate length for connecting the 'n' elements.

An embodiment of the invention will now be described by way of example with reference to the accompanying drawings in which:

FIGS. 9 to 27 show grid representations of part of a circuit board during successive stages in the operation of a flooding algorithm used to derive a route between source and target cells; and FIGS. 28 to 31 show grid representations of part of a circuit board showing operation of a road map feature of the flooding algorithm.

FIG. 33 shows an example of a computer system which performs the routine routing method.

Figure 1:
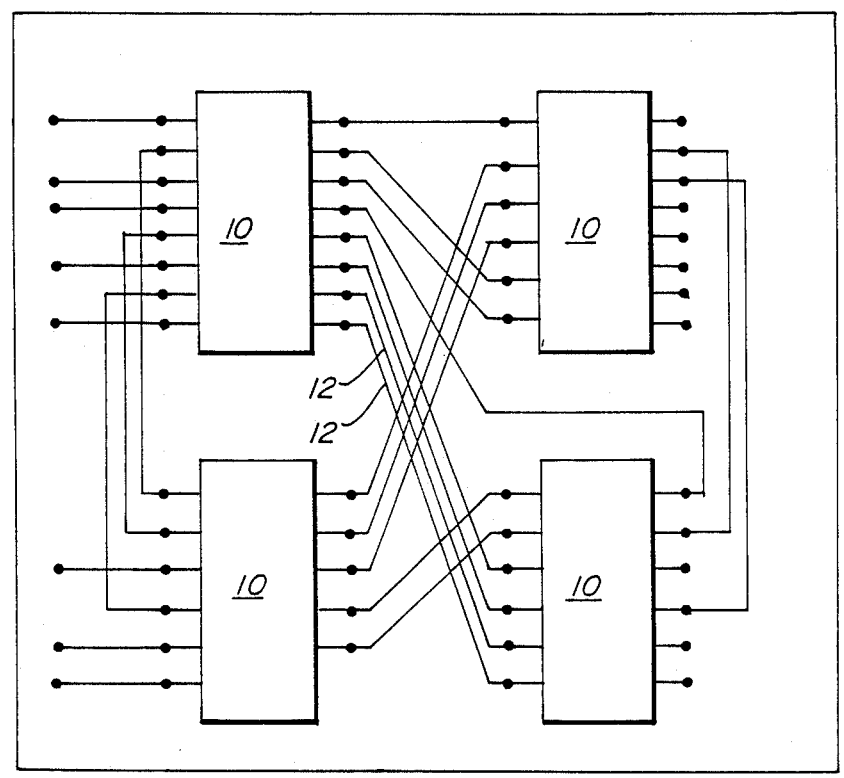
FIG. 1 is a schematic plan view of a printed circuit board showing a number of direct spanning conductor routes between integrated circuit chips.

As shown in FIG. 1, the shortest routes for interconnecting integrated circuit packages 10 are routes extending directly between the IC package pins 12. However, this arrangement gives rise to many overlapping routes. This is untenable since overlapping routes can only be electrically separated by employing a large number of circuit board layers insulated from one another.

Figure 2:
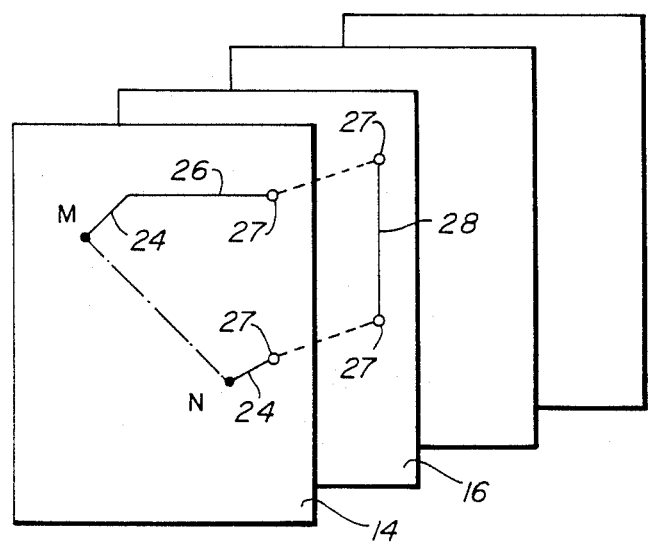
FIG. 2 shows a grid representation of part of a simple multilayer circuit board showing a single interconnection and its corresponding conductor route.

Shown in FIG. 2 is a typical practical route between points M and N at the top layer of a four-layer board. The route includes two short diagonal segments 24 and an east-west segment 26 on a top board layer 14, two vias 27 to a lower board layer 16 and a north-south segment 28 on the lower layer. This route uses predominantly east-west and north-south sections. Additionally, the east-west route sections are located predominantly in board layers where there are few north-south route sections and vice versa to obtain high route density.

Figure 3:
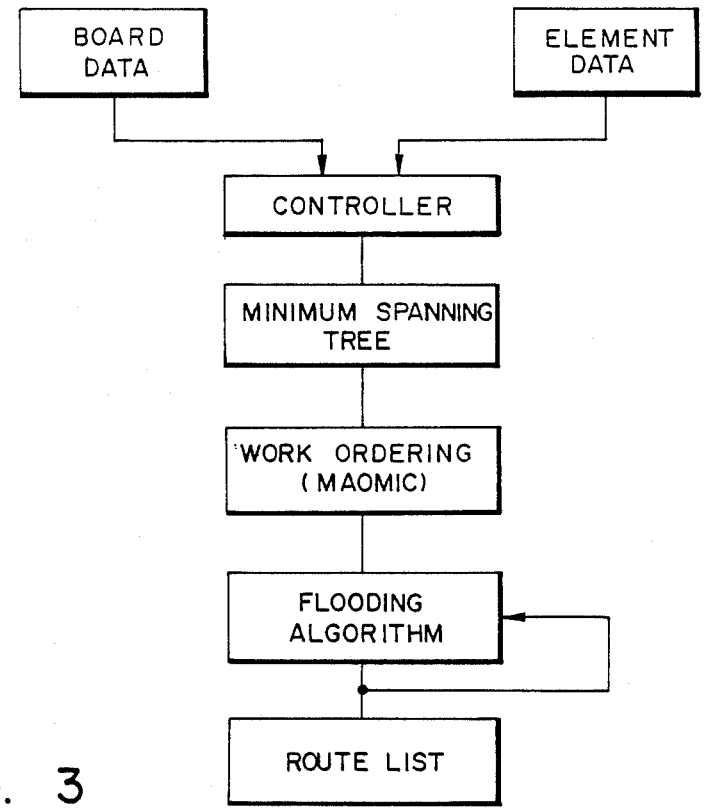
FIG. 3 is a flow diagram showing operation of a routing method according to the invention.

Referring to FIG. 3, input data for a routing method consists of board data and element data.

Typically the board data defines the board dimensions, number of board layers, a grid size, and the technology. The grid size data determines how the interconnection medium is to be notionally divided into cells, and the technology file sets certain constraints, for example, on the thickness of routes and their mutual spacing.

The element data defines the shape, size and position of elements, and the signals and sumnets of these elements. Effectively, the element data lists a set of disconnections.

The board and element data are fed to a controller which subjects data to a known minimum spanning tree (MST) algorithm to determine the minimum length of direct spans required to connect elements of the same signal. The MST algorithm selects a list of interconnections from the list of disconnections.

Subsequently at a MAOMIC (MAximum Occupancy MInimum Capacity) ordering section, the interconnections are ranked in the order in which routes are to be derived, i.e. the work order.

At a flooding section, a flooding routine is used to derive a route for each of the interconnections in turn. The output of the router is data representing a list of line segments having length, position and orientation. This output data is used to implement the routes as copper lines and vias on a printed circuit board.

Considering the various parts of the method in detail, to initiallize the routing process, board data is recorded in the form of a cell memory map. The area of the multi-layer board is notionally divided into a maximum of $2^{20}$ rectangular cells in an XY grid, data being stored at each of a corresponding number of cell addresses. The board is divided vertically into a number of layers so the cell addresses also include a Z component.

Figure 4:
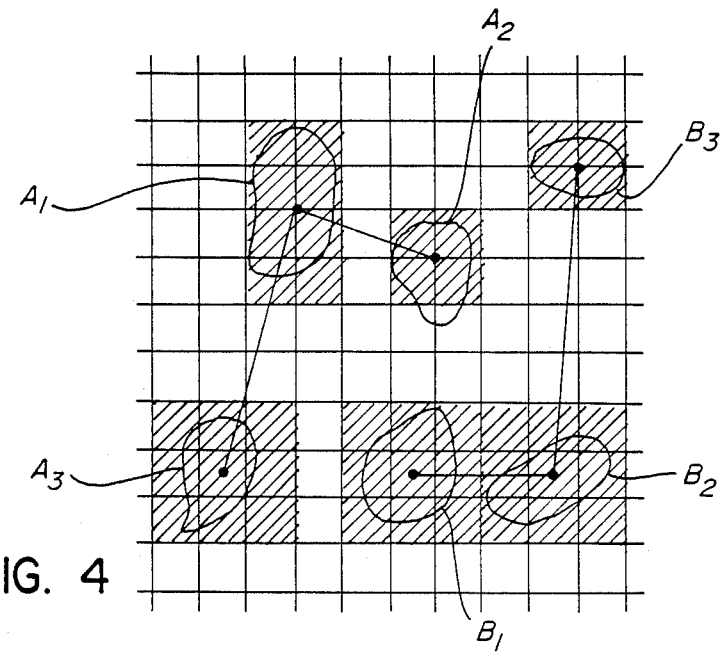
FIG. 4 shows a grid representation of a group of elements wth their respective signal and sumnet data.

As indicated previously a selection of interconnections is made from the disconnections using the MST algorithm. Thus referring to FIG. 4, any three elements $A_1$, $A_2$ and $A_3$ having the same signal but different sumnet can be connected by disconnections $A_1A_2$ and $A_2A_3$, or $A_1A_3$ and $A_1A_2$, or $A_1A_3$ and $A_3A_2$. Using the MST algorithm, each element is analyzed to define the boundary of a rectangle into which it fits. The center of the rectangle is given XY coordinates as are all other rectangles derived from elements of the same signal. The interconnections for those common signal elements are then listed starting with the minimum length required to effect an interconnection between two centers, then the next longest, etcetera until all elements of the same signal would, if the interconnections were actually made, have the same sumnet.

As briefly indicated previously, a list corresponding to the order in which routes are to be derived is then derived from the unordered MST list.

Sorting of interconnections may be based on any one of a number of known ordering schemes, and multiple passes through a flooding routine described subsequently may utilize different ones of the ordering schemes. During at least one pass through the ordering routine, the order for assigning routes depends on a set of MAOMIC (maximum occupancy minimum capacity) factors.

To develop the MAOMIC factors, the board and element data is first mapped onto the memory map. At each cell within the memory map, there is a permanent and a temporary storage location. In a cell encoding process, each of the cells is given one of the flags 00 to 15 which are listed below together with their binary coded decimal equivalents.

| 00 | CELL EMPTY AND AVAILABLE FOR INTERCONNECTION | 0000 |
|---|---|---|
| 01 | CELL RESTRICTED BY VIA THROUGH BOARD | 0001 |
| 02 | EDGE CELL | 0010 |
| 03 | TARGET CELL | 0011 |
| 04 | COPPER OR COMPONENT ALREADY PRESENT | 0100 |
| 05 | SEED CELL | 0101 |
| 06 | NORTH | 0110 |
| 07 | SOUTH | 0111 |
| 08 | EAST | 1000 |
| 09 | WEST | 1001 |
| 10 | NORTHWEST | 1010 |
| 11 | SOUTHWEST | 1011 |
| 12 | SOUTHEAST | 1100 |
| 13 | NORTHEAST | 1101 |
| 14 | UP | 1110 |
| 15 | DOWN | 1111 |

As a result of the encoding process, certain of the cells are recorded as empty (00) and therefore available for flooding whereas the others are recorded as full (01 to 15).

Figure 5:
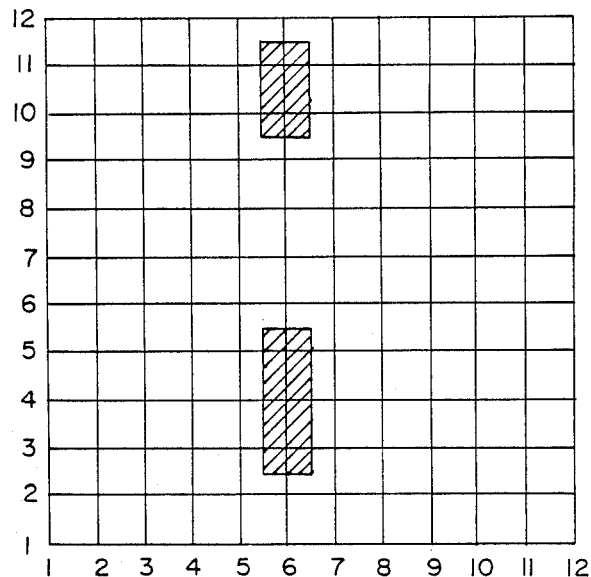
FIGS. 5 to 8 show grid representations of part of a circuit board showing the occupancy and capacity of several grid lines.
Figure 6:
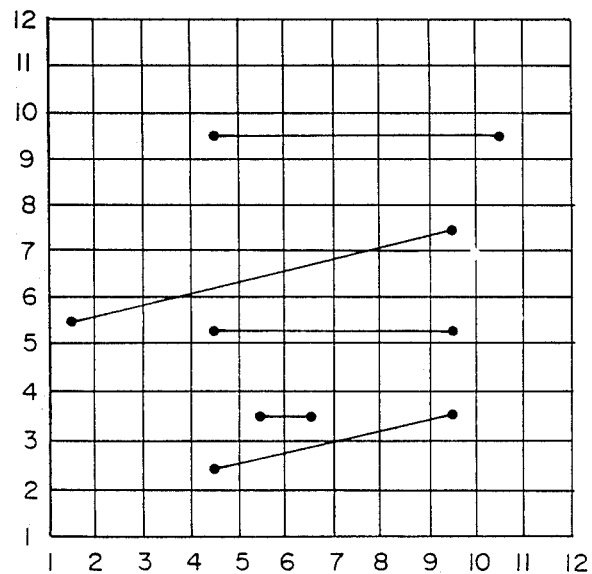
Figure 7:
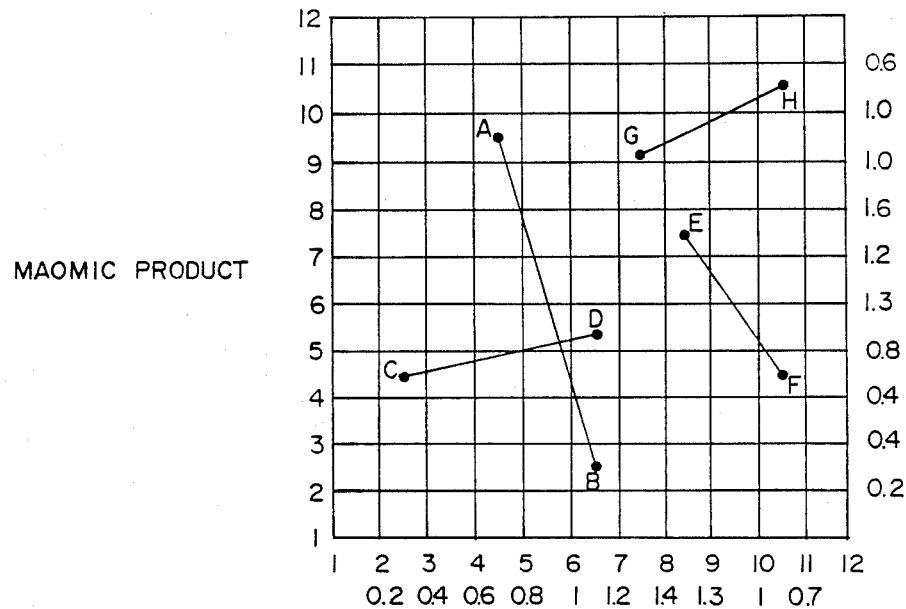

With reference to FIG. 5, to obtain a MAOMIC factor, the vertical and horizontal grid lines defining cell positions are considered and for each grid line, a capacity assessment (N) is made, FIG. 5, this being the number of cells or grid positions along the length of the grid line that are empty and therefore can accommodate a route crossing. As shown in FIG. 5, five out of the ten possible horizontal grid lines are full at the vertical x=6 (N=5). Then an occupancy assessment (M) is made as to how many connections would, if made to span directly between elements, cross each grid line. As shown in FIG. 6, five routes would cross grid line x=6 if the routes were directly drawn (M=5). MAOMIC factors, being the products of the occupancy and inverse capacity, are derived for each grid line, the MAOMIC factor of x=6 being $M \times 1/N = 1$. A MAOMIC factor is derived for every vertical and horizontal grid line. Each interconnection is then labelled with the highest MAOMIC product of all the grid lines which it crosses. Thus, in the five interconnections of FIG. 7, the MAOMIC factors are AB: 1.6, GH: 1.4, EF: 1.3 and CD: 1.0. The work to be done is then listed in decreasing MAOMIC factor order. In the embodiment described, the grid spacing is the same as the permitted conductor route spacing to facilitate derivation of the MAOMIC factors. The circuit board of FIG. 5 is simplified in that it is two-dimensional, consisting of a single board layer. However, the MAOMIC factor can be readily derived for grids of a three-dimensional interconnection medium.

The MAOMIC routine results in a work order list of pairs of elements requiring interconnection.

As part of the cell encoding procedure, the cell data is crystallized. During crystallization and referring to FIG. 8, a cell is selected within each element to be the seed cell (05). The other cells of the element, i.e. those having the same signal and sumnet are considered. Each of the cells is related to the element seed by a system of backpointers (06 to 15), the pointers being north, south, east, west, northwest, northeast, southwest, southeast, up (for a cell in an underlying board layer) and down (for a cell in an overlying board layer).

Figure 8:
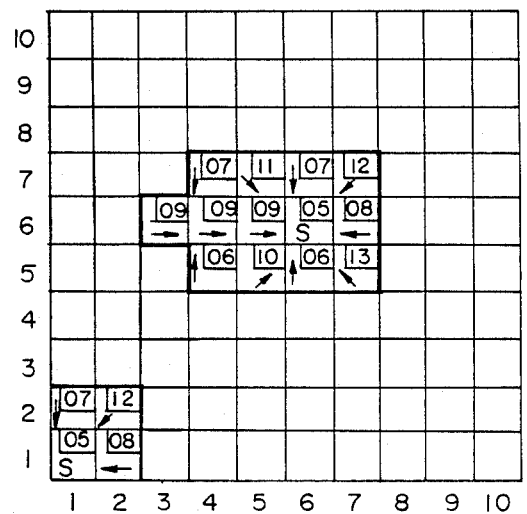

Referring to FIG. 8, a seed cell shown as S is located at position (6,6). The cells around (6,6) have pointer directions corresponding to the cardinal and half-cardinal points. Back pointer directions for the next outer layer of cells within the element are assigned by successively considering the inner cells as temporary seeds and so on until backpointers have been allocated to all of the elements in the MAOMIC listing.

In the flooding routine, each of the listed pairs of elements are considered in turn. The smaller element is selected as a source area and the other as a target area (FIG. 8). The backpointer data of the target cells is deleted and is replaced by target (03) encoding.

The principle of the flooding routine is then tentatively to move from the source into surrounding successive fronts of empty cells of the memory map until the target is reached. In the memory map initially derived, each cell has in its permanent store a flag which indicates whether the cell is full (01 to 15) or available for flooding (00) and if it is full, the reason why. A full cell is not available for interconnection routing. The possible flags with binary coded flag data are as shown previously.

In geometrical terms, the length of moving from one cell to another is the length of a single cell. However in according routes to a particular layer of a circuit board, it is preferred that the copper routes on any one layer extend predominantly in one direction to obtain maximum packing density. Thus, typically in a top board layer, copper routes may be predominantly north-south and in an underlying layer predominantly east-west. So that the layer routing preference can be taken account of in the flooding routine, the north and south pointer directions are given a lower cost than the east and west pointer directions in the top board and vice versa in the lower board layer. The half-cardinal directions such as northeast and southwest are registered as more costly and the vertical routes up and down are registered as the most costly. The cost of the routes is selected for a particular board design. A typical pointer cost list is shown below. The list corresponds to a four-layer board in which north-south routing is predominant in layers 1 and 3 and east-west routing is predominant in layers 0 and 2. In this cost list, a "0" cost means that routing in such a direction is not permitted.

|  | N | S | E | W | NE | NW | SE | SW | UP | DN |
|---|---|---|---|---|---|---|---|---|---|---|
| Board layer 0 | 0 | 0 | 1 | 1 | 9 | 9 | 9 | 9 | 3 | 3 |
| Board layer 1 | 1 | 1 | 0 | 0 | 9 | 9 | 9 | 9 | 3 | 3 |
| Board layer 2 | 0 | 0 | 1 | 1 | 9 | 9 | 9 | 9 | 3 | 3 |
| Board layer 3 | 1 | 1 | 0 | 0 | 9 | 9 | 9 | 9 | 3 | 3 |

For operating the flooding routine, $2^8$ storage bins are set up for storing cell addresses corresponding to a particular route cost, i.e. the cost of moving to a cell from a source seed cell. To derive a route, the addresses of all cells of the source are first stacked into a cost 0 bin. The cost of a route from the source seed to another cell in the source is 0 since the source is a single set of interconnected full cells representing a single conducting entity. As a move is made into a cell which is not the source, however, the cost is increased from 0.

In the flooding routine, a cell address is selected from the lowest cost bin containing cell addresses, for example, the bin of cost A. Whenever a cell is selected from a bin, its address and backpointer direction are transferred to the temporary store in the memory map. Cells adjacent to the selected cell are inspected.

If an inspected cell is not full, then its address and the pointer direction back to the selected cell are stored in the cost (A+X) bin where X is the cost of moving from the selected cell to the cell being inspected. The remaining empty cells around the selected cell are then inspected in turn. The same procedure is adopted for the remaining cells in the cost A bin. Initially the cells are selected from the cost 0 bin since this is occupied by the source cells. When the cost 0 bin is empty, cells are selected from the cost 1 bin and so on.

Because normally there exist several ways to move into a particular cell from cells adjacent to it, the address of that particular cell address may appear in a number of the bins. However, once a cell has been selected and entered in the temporary store of the memory map, the address of the cell is discarded from any higher order storage bins.

Eventually, after a number of iterations of the flooding routine, a target (03) cell is reached as a result of the inspection process. The flooding routine is however continued until a target cell has been selected from its cost bin and transferred to the memory map. Since the data related to each cell visited in the flooding routine includes a backpointer direction, the cell data is, in effect, stored in association with the data of the next cell into which flooding takes place. Thus when a target cell is reached, the path through the flooded cells by which the target cell was reached can be traced back to the source.

Following a target strike, the routing procedure goes through ionization and recrystallization routines. In the ionization routine, the target (03) flags in the temporary storage locations of the target cells are replaced by copper flags (04). Then in the recrystallization routine, pointer directions are assigned to the target cells relative to the source seed, and these backpointer directions are assigned to the permanent store.

When a route is derived, then the pair of interconnected elements form, in effect, a single new element. The list of interconnections is immediately edited by destroying the target sumnet within the list of work to be done and replacing the interconnected elements by the new element.

The flooding routine is repeated to effect routes for each of the interconnections in order. The result stored is a list of contiguous linear route segments having length, position and orientation. The list of linear segments can be readily used in the manufacture of integrated circuit boards.

A complete example of use of the flooding algorithm including encoding and traceback steps follows with reference to FIGS. 9 to 27.

Figure 9:
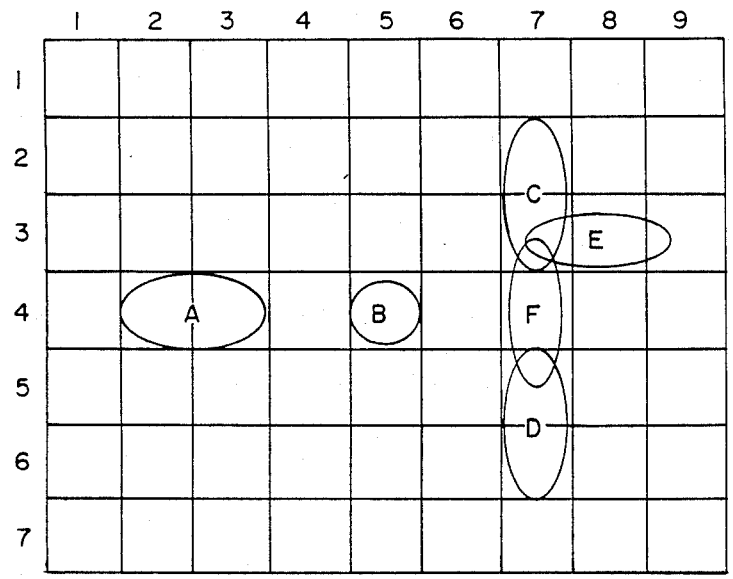

STEP 1—Input—FIG. 9

A typical input shown with 6 elements:

| A | Signal | S | Sumnet | N | = Structure 1 |
|---|--------|---|--------|---|---------------|
| B | Signal | R | Sumnet | K | = Structure 2 |
| C | Signal | S | Sumnet | M | = Structure 3 |
| D | Signal | S | Sumnet | M | = Structure 3 |
| E | Signal | S | Sumnet | M | = Structure 3 |
| F | Signal | S | Sumnet | M | = Structure 3 |

Structure 1 must be connected to structure 3 since it has the same signal but a different sumnet. Structure 2 is and must remain disconnected.

Figure 10:
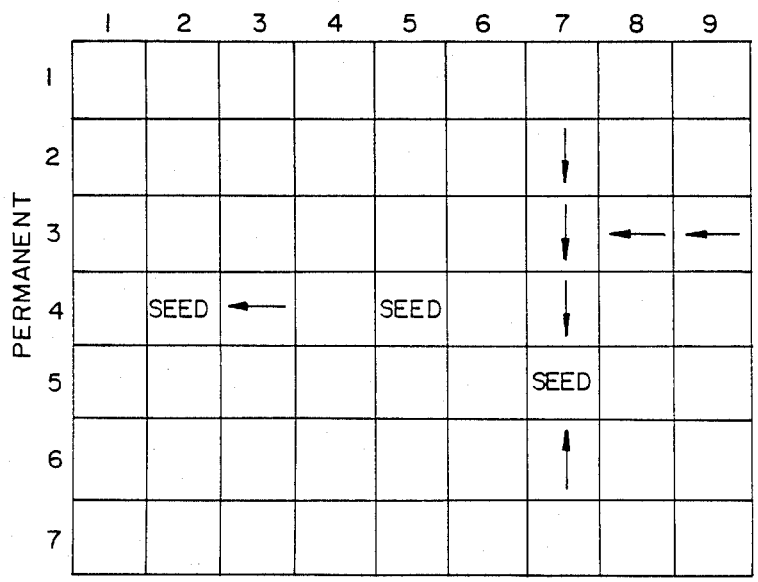

STEP 2—Encoding—FIG. 10

The permanent storage encoding of the cell map:

Structure 1 is seeded at (2,4)
Structure 2 is seeded at (5,4)
Structure 3 is seeded at (7,5)
Blank cells are empty (00)

STEP 3—Encoding—FIG. 11

The corresponding temporary storage encoding prior to flooding shows:

C = copper = 04
blank = empty = 00

Incremental costs are:

N - S = 3
E - W = 1
half-cardinal directions = 5

| Cost Bin | Contents |
|----------|----------|
| 0 | All bins are empty |
| 1 | |
| 2 | |
| 3 | |
| 4 | |
| 5 | |
| 6 | |

STEP 4—Preparation—FIG. 12

After preparation of the source and the target, the temporary storage contents are as shown.

1. The source has been emptied and the cells are in the cost 0 bin with their proper backpointer (seed)
2. The target is marked with T=target=03

Other structures are left unchanged. Initially, permanent storage will not be modified by the flooding algorithm.

| Cost Bin | Contents |
|----------|----------|
| 0 | (2,4) seed (3,4) |
| 1 | |
| 2 | |
| 3 | |
| 4 | |
| 5 | |
| 6 | |

STEP 5—Extract—FIG. 13

The first cell from the least cost bin (0) is picked up. This is the (2,4) seed having a base cost=0.

The temporary storage at (2,4) is checked for empty; it is.

The backpointer (seed) is written in temporary storage.

Then the visit of the eight neighboring cells begins; Going North first, the cell at (2,3) is examined.

It is empty; so its address and a backpointer (south) is stored in bin of cost=base cost+increased cost of North, i.e. the (bin for cost=0+3=3)

| Cost Bin | Contents |
|----------|----------|
| 0 | (3,4) seed |
| 1 | |
| 2 | |
| 3 | (2,3) S |
| 4 | |
| 5 | |
| 6 | |

STEP 6—Visit—FIG. 14

Next visit the other neighboring cells

| Neighbor | Address | Empty | Backpointer | Incr. Cost | Bin |
|----------|---------|-------|-------------|------------|-----|
| South | (2,5) | yes | N | +3 | 3 |
| East | (3,4) | yes | W | +1 | 1 |
| West | (1,4) | yes | E | +1 | 1 |
| Northeast | (3,3) | yes | SW | +5 | 5 |
| Northwest | (1,3) | yes | SE | +5 | 5 |
| Southeast | (3,5) | yes | NW | +5 | 5 |
| Southwest | (1,5) | yes | NE | +5 | 5 |

| Cost Bin | Contents |
|----------|----------|
| 0 | (3,4) seed |
| 1 | (3,4) W (1,4) E |
| 2 | |
| 3 | (2,3) S (2,5) N |
| 4 | |
| 5 | (3,3) SW (1,3) SE |
|   | (3,5) NW (1,5) NE |
| 6 | (3,5) N (1,5) N |

STEP 7—Flood——FIG. 15

Extract the next cell from the least cost non-empty bin. This is cell (3,4) in the bin of cost 0. The cell at (3,4) temporary store is empty. Visit neighbors.

| Neighbor | Address | Empty | Backpointer | Inc. Cost | Bin |
|----------|---------|-------|-------------|-----------|-----|
| N | (3,3) | yes | S | +3 | 3 |
| S | (3,5) | yes | N | +3 | 3 |
| E | (4,4) | yes | W | +1 | 1 |
| W | (2,4) | no | | | |
| NE | (4,3) | yes | SW | +5 | 5 |
| NW | (2,3) | yes | SE | +5 | 5 |
| SE | (4,5) | yes | NW | +5 | 5 |
| SW | (2,5) | yes | NE | +5 | 5 |

| Cost Bin | Contents |
|----------|----------|
| 0 | |
| 1 | (1,4) E (4,4) W |
| 2 | |
| 3 | (2,3) S (2,5) N (3,3) S (3,5) N |
| 4 | |
| 5 | (3,3) SW (1,3) SE (3,5) NW (1,5) NE |
|   | (4,3) SW (2,3) SE (4,5) NW (2,5) NE |
| 6 | |

STEP 8—Flood—FIG. 16

Extract next cell from the least cost non-empty bin (1) (1,4) East having base cost=1. Cell at (1,4) temporary is empty.

| Neighbor | Address | Empty | Backpointer | Inc. Cost | Bin |
|---|---|---|---|---|---|
| N  | (1,3) | yes | S  | +3 | 4 |
| S  | (1,5) | yes | N  | +3 | 4 |
| E  | (2,4) | no  | —  | —  | — |
| W  | —     | —   | —  | —  | — |
| NE | (2,3) | yes | SW | +5 | 6 |
| NW | —     | —   | —  | —  | — |
| SE | (2,5) | yes | NW | +5 | 6 |
| SW | —     | —   | —  | —  | — |

| Cost Bin | Contents |
|---|---|
| 0 | |
| 1 | |
| 2 | (4,4) W |
| 3 | (2,3) S (2,5) N (3,3) S (3,5) N |
| 4 | (1,3) S (1,5) N |
| 5 | (3,3) SW (1,3) SE (3,5) NW (1,5) NE (4,3) SW (2,3) SE (4,5) NW (2,5) NE |
| 6 | (2,3) SW (2,5) NW |

STEP 9—Flood—FIG. 17

Extract cell from the least cost non-empty bin (1) (4,4) West, base cost=1; cell at (4,4) temporary is empty.

| Neighbor | Address | Empty | Backpointer | Incr. Cost | Bin |
|---|---|---|---|---|---|
| N  | (4,3) | yes | S  | +3 | 4 |
| S  | (4,5) | yes | N  | +3 | 4 |
| E  | (5,4) | no  | obstacle not to be run over | | |
| W  | (3,4) | no  | already reached at a lower cost | | |
| NE | (5,3) | yes | SW | +5 | 6 |
| NW | (3,3) | yes | SE | +5 | 6 |
| SE | (5,5) | yes | NW | +5 | 6 |
| SW | (3,5) | yes | NE | +5 | 6 |

| Cost Bin | Contents |
|---|---|
| 0 | |
| 1 | |
| 2 | |
| 3 | (2,3) S (2,5) N (3,3) S (3,5) N |
| 4 | (1,3) S (1,5) N (4,3) S (4,5) N |
| 5 | (3,3) SW (1,3) SE (3,5) NW (1,5) NE (4,3) SW (2,3) SE (4,5) NW (2,5) NE |
| 6 | (2,3) SW (2,5) NW (5,3) SW (3,3) SE (5,5) NW (3,5) NE |

STEP 10—Flood—FIG. 18

Extract cell from the least cost, non-empty bin (3) (2,3) South, base cost=3; cell at (2,3) temporary is empty.

The visit to neighboring cells proceeds as before. For brevity purposes, the second appearance of the address of cells in the cost bins is replaced by a dot. The validity of this simplification is explained in step 13.

| Cost Bin | Contents |
|---|---|
| 0 | |
| 1 | |
| 2 | |
| 3 | (2,5) N (3,3) S (3,5) N |
| 4 | (1,3) S (1,5) N (4,3) S (4,5) N (3,3) W (1,3) E |
| 5 | ... |
| 6 | ... (5,3) SW · (5,5) NW · (2,2) S |

STEP 11—Flood—FIG. 19

The last three addresses are extracted from the least cost bin (3) and their neighbors are visited.

| Cost Bin | Contents |
|---|---|
| 0 | |
| 1 | |
| 2 | |
| 3 | |
| 4 | (1,3) S (1,5) N (4,3) S (4,5) N (3,3) W (1,3) E (3,5) W (1,5) E (4,3) W (4,5) W |
| 5 | ... |
| 6 | ... (5,3) SW · (5,5) NW · (2,2) S (2,6) N (3,2) S (3,6) N |

STEP 12—Flood—FIG. 20

The first four cells are then extracted from least cost bin (4) and their neighbors are visited.

| Cost Bin | Contents |
|---|---|
| 0 | |
| 1 | |
| 2 | |
| 3 | |
| 4 | (3,3) W (1,3) E (3,5) W (1,5) E (4,3) W (4,5) W |
| 5 | ... (5,3) W (5,5) W |
| 6 | ... (2,3) S (2,6) N (3,2) S (3,6) N |

STEP 13—Flood—FIG. 21

Extract the next address from the least cost non-empty bin (4) (3,3) W, base cost=4; cell at (3,3) temporary is not empty. This means that that cell already flooded is at a lesser or equal cost and so no visit to it is required.

| Cost Bin | Contents |
|---|---|
| 0 | |
| 1 | |
| 2 | |
| 3 | |
| 4 | (1,3) E (3 5) W (1,5) E (4,3) W (4,5) W |
| 5 | ... (5,3) W (5,5) W |
| 6 | ... (2,2) S (2,6) N (3,2) S (3,6) N |

STEP 14—Flood—FIG. 22

The flooding progresses until cell (6,3) W is extracted from the least cost bin (6). It was put there by the eastward visit from cell (5,3) in cost bin 5. From (6,3) when visiting the eastward neighbor at (7,3), the temporary storage is found to contain T (target 03). The algorithm considers (7,3) to be empty and stores (7,3) W in cost bin 7. The algorithm progresses as usual.

Figure 23:
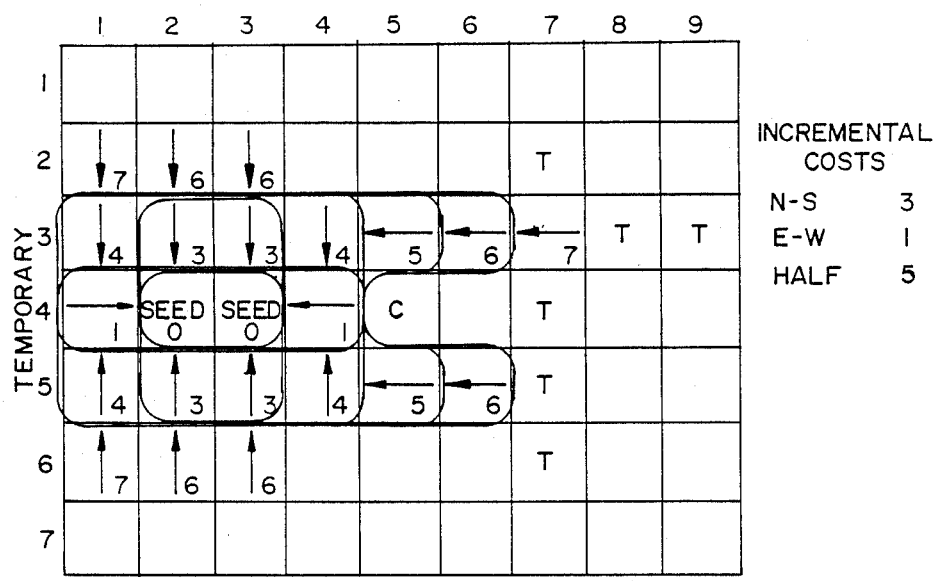

STEP 15—Finish—FIG. 23

When (7,3) W is extracted from the least cost bin 7, the temporary storage is found to contain T (target 03).

Under these circumstances, the backpointer is stored at (7,3) temporarily and the flooding algorithm terminates successfully. The reach cost is 7. The numbers in FIG. 20 show the cost bins from which the backpointers are extracted to illustrate the wavefront progression of the flooding algorithm.

Figure 24:
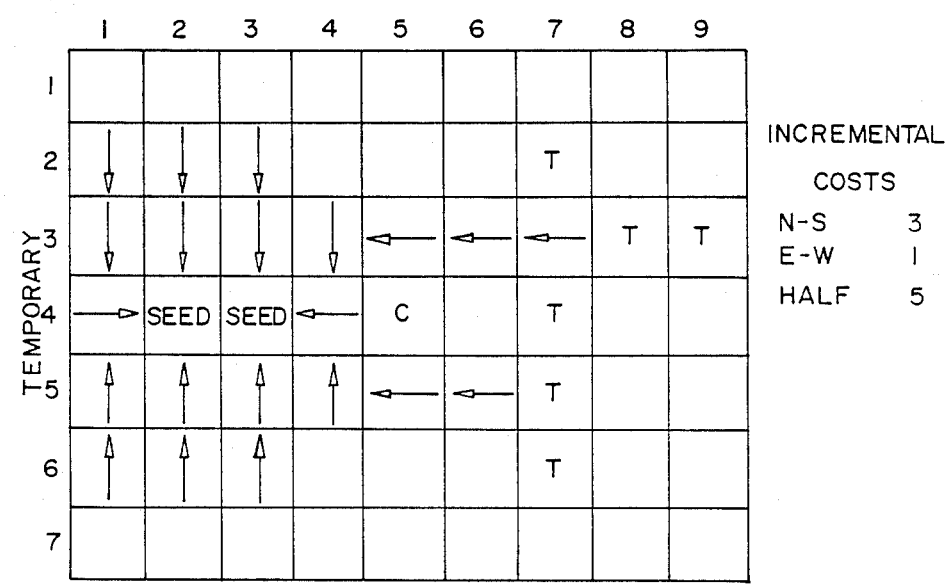

STEP 16—Traceback—FIG. 24

The traceback routine starts from (7,3) and follows the backpointers in sequence.

| | |
|---|---|
| (7,3) W | |
| (6,3) W | line 1 from (7,3) to (4,3) = new elements G (FIG. 25) |
| (5,3) W | |
| (4,3) S | line 2 from (4,3) to (4,4) = new element H |
| (4,4) W | |
| (3,4) Seed | line 3 from (4,4) to (3,4) = new element I |

STEP 17—FIG. 25

Figure 25:
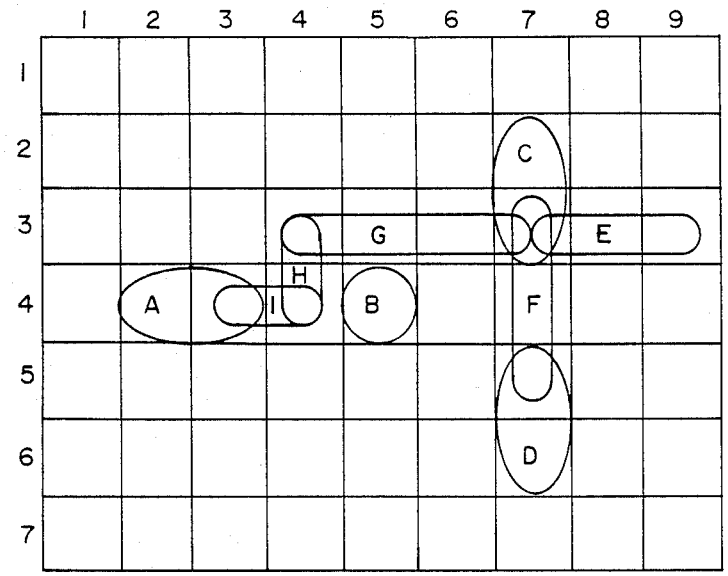

Considering FIGS. 9 and 25 the routing results in:

| | | | |
|---|---|---|---|
| A | Signal S | Sumnet N | Structure 1 |
| B | Signal R | Sumnet K | Structure 2 |
| C | Signal S | Sumnet N | Structure 1 |
| D | | | Structure 1 |
| E | | | Structure 1 |
| F | | | Structure 1 |
| G | | | Structure 1 |
| H | | | Structure 1 |
| I | | | Structure 1 |
| Sumnet M of signal S has disappeared | | | |

Figure 26:
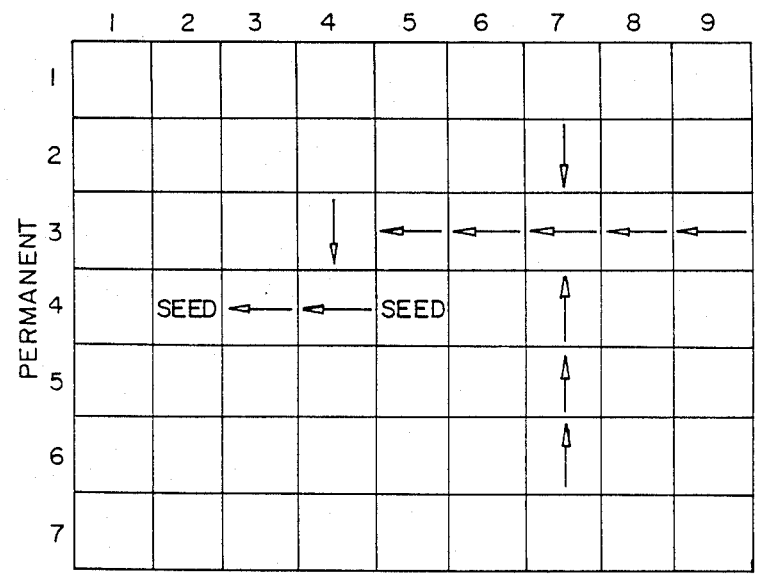

STEP 18—Clean—FIG. 26

The permanent storage structures are then adjusted as shown.

Figures 27, 28, 29:
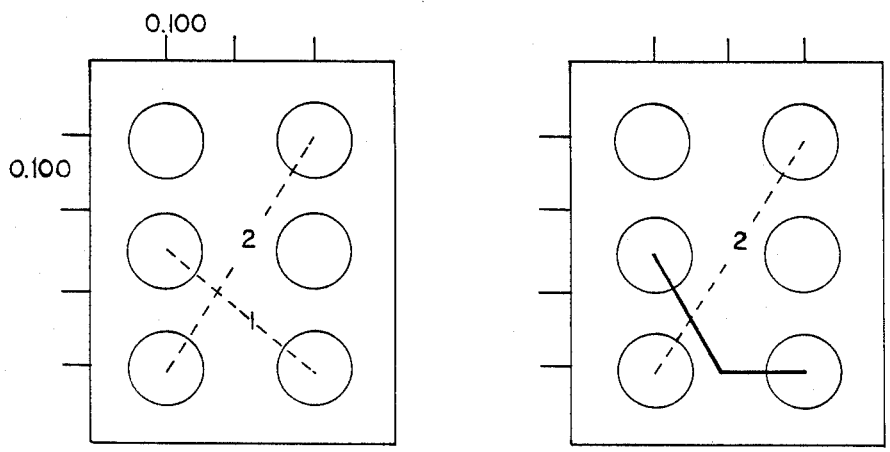

STEP 19—Clean—FIG. 27

The temporary storage is cleared of the expansion data and reset to model the contents of the permanent storage. All bins are cleared of address and backpointer data. The cell map and bins are ready for another exercise of the flooding algorithm.

In combination with the MAOMIC ordering scheme described previously, this flooding routine provides an effective compromise between route efficiency and low memory requirement.

At some locations, flooding in certain directions is not permitted. This is true for certain cardinal directions at the different board layers. It is also true close to integrated circuit pins. Thus, a typical dual in-line package (DIP) has pins on 100 mil centers. The DIP packages are usually mounted within a regular array so that, considering the cell map, the top left-hand pin of a package might be at vertical height Y=N00 with the next lower pin at vertical height Y=(N−1) 00, etcetera. Moreover, corresponding pins of adjacent DIPs are often interconnected. A grid of 0.020 spacing has a standard conductor spacing of 20 cells and a circular pin solder area of diameter 50 cells. This leaves room for only 2 conductors in a 100 grid spacing. To most effectively use the space around pins for routing, all route assignments are made subject to a road map which forces some routing discipline over the flooding algorithm.

In the 0.020 inch grid example, pins and vias are restricted to a 0.100 inch grid in order to make board manufacture and board testing easier. Conductors however, have no such restriction and can be placed anywhere on the 0.020 inch grid. If the flooding algorithm is left to roam freely over the cell map, inefficient use of the board area may arise as exemplified with reference to FIGS. 28 and 29. FIG. 28 shows dotted lines at interconnections to be made. The number order is the MAOMIC order. A random use of the board area would block a direct interconnection at path 2 (FIG. 29).

Figure 30:
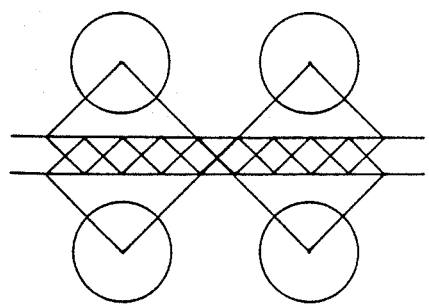
Figure 31:
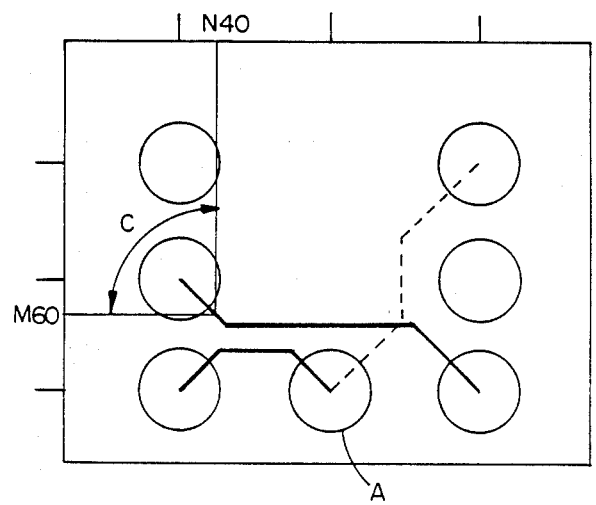
Figure 32:
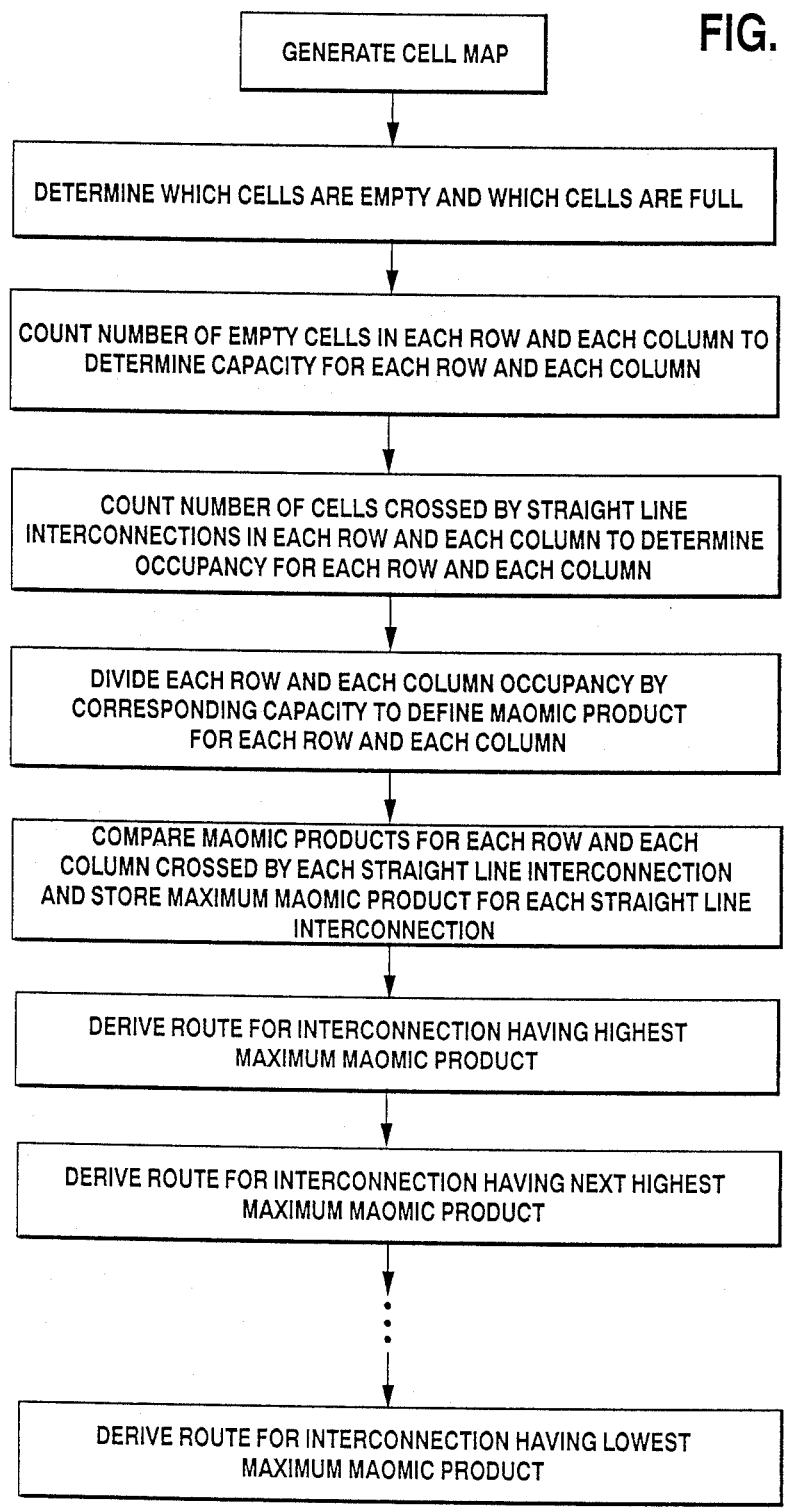
FIG. 32 is a flow diagram of the method of the invention.

To solve this problem, the road map shown in FIG. 30 is used during the flooding process. When a cell is extracted from the least cost non-empty bin, its position on the road map is identified. For example, a cell C at (0.N40, 0.M60) is identified in FIG. 31. The road map is used to control the neighbor positioning process. In the case of C, visits are restricted to NW, W, SW, SE and E thus preventing undesirable flooding towards N, NE and S. Under road map control, the previous example is completed as shown in FIG. 31 where broken lines are tracks on a lower layer and a via is present at location A.

In this specific example, the road map keeps the flooding algorithm from grid lines 0.020 and 0.080, thus providing a better utilization of the space where vias must be positioned. An example of a computer system which performs the routing method is illustrated in FIG. 33. The workstation 40 enables inputting of data to and outputting of data from a central processing unit 42. The central processing unit 42 and the memory 44 perform the routing method. Data can also be output to a plotter 46.

A secondary effect of the road map is substantially to reduce the amount of computer time and computer storage required to run the flooding algorithm. Time is saved by preventing undesirable visits and space is saved by saving on bin storage.

A different technology file may have different package pin size, shape and spacing and a different grid size.

Within the confines of developing the MAOMIC work order and running the flooding algorithm, the system permits several extensions.

Thus, in one modification of the system, limits are set to the vertical travel between board layers by specifying, for example, only two vias in any interconnect route.

In another extension, an initial pass is made through the work order to assign only the most efficient straight and "L" shaped routes at a single board layer to those interconnections susceptible of such routing. In further passes through the work order, more complex routes which may extend to multiple layers are assigned.

In another modification, a ceiling can be placed on the cost of any route. When each piece of work is performed, the route, its cost, etcetera is checked against a limitation indicator.

In yet another modification, a particular margin is set. Thus considering the minimum area rectangle which can cover a source and a target to be connected to that source, the margin is the extent to which a larger rectangle extends beyond the minimum area rectangle. If a small margin is set, then the interconnections must be within or very close to the minimum area rectangle.

Although the routing method is described in the context of a multilayer printed circuit board, it will be appreciated that the connection method has a more universal application.

It will be recognized that the MAOMIC and flooding routines can be performed by suitably programming a computer, the computer having a memory for storing the memory map, the temporary and permanent results of running the flooding routine, the cost bins and their contents, the road map limitations, etcetera.

What is claimed is:

1. A method, to be carried out by a computer, of deriving routes of interconnections between elements in a connection medium, comprising the steps of:

generating a cell map consisting of a number of addressable cells representing grid positions in the connection medium;

designating certain of the cells which can accommodate routes as empty and designating remaining ones of the cells which cannot accommodate routes as full;

counting the number of empty cells in each of a plurality of rows of cells and columns of cells to define a capacity for each row and each column;

counting the number of cells in each row and each column which would be crossed by an interconnection if each interconnection extended along a straight line linking elements to be interconnected to define an occupancy for each row and each column;

dividing each row and column occupancy by a corresponding capacity to define a MAOMIC product for each row and each column;

comparing the MAOMIC products of each row and each column crossed by each straight line interconnection and storing the maximum MAOMIC product for each straight line interconnection; and deriving routes for said interconnections in descending order of the MAOMIC products associated with said interconnections.

2. A method as claimed in claim 1 in which the routes have a predetermined width and a minimum permitted spacing so that a maximum number of routes are permitted to pass perpendicularly across each column of cells and a maximum number of routes are permitted to cross each row of cells, and wherein the number of cells in each column of cells equals the maximum number of routes permitted to cross that column of cells and the number of cells in each row of cells equals the maximum number of routes permitted to cross that row of cells.

3. A method as claimed in claim 1 wherein the cells represent square regions in the connection medium.

4. A method as claimed in claim 1 particularly for routing connections between elements in an electrical circuit in which several elements of the circuit can have a common signal applied thereto, the method comprising running a minimum spanning tree routine to select from n disconnections between n elements having a common signal $(n-1)$ interconnections, said $(n-1)$ interconnections having an aggregate direct interconnection span length which is a minimum aggregate length for connecting said n elements.

* * * * *

UNITED STATES PATENT AND TRADEMARK OFFICE
CERTIFICATE OF CORRECTION

PATENT NO.   : 4,858,143
DATED        : August 15, 1989
INVENTOR(S)  : Serge Fournier It is certified that error appears in the above-identified patent and that said Letters Patent is hereby corrected as shown below:

Title page:

73 Assignee should read --NORTHERN TELECOM LIMITED-- instead of "Bell-Northern Research, Ltd."

Signed and Sealed this

Tenth Day of July, 1990

Attest:

HARRY F. MANBECK, JR.

*Attesting Officer*　　　　　*Commissioner of Patents and Trademarks*